(12) United States Patent
Yuan

(10) Patent No.: US 12,439,696 B2
(45) Date of Patent: Oct. 7, 2025

(54) DEMULTIPLEXING CIRCUIT AND CONTROL METHOD THEREOF AND DISPLAY DEVICE

(71) Applicant: Guangzhou China Star Optoelectronics Semiconductor Display Technology Co., Ltd., Guangdong (CN)

(72) Inventor: Dong Yuan, Guangdong (CN)

(73) Assignee: Guangzhou China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 18/567,050

(22) PCT Filed: Sep. 11, 2023

(86) PCT No.: PCT/CN2023/118029
§ 371 (c)(1),
(2) Date: Dec. 5, 2023

(87) PCT Pub. No.: WO2025/050417
PCT Pub. Date: Mar. 13, 2025

(65) Prior Publication Data
US 2025/0098306 A1    Mar. 20, 2025

(30) Foreign Application Priority Data
Sep. 4, 2023   (CN) .......................... 202311133956.4

(51) Int. Cl.
*H10D 86/60*   (2025.01)
*G09G 3/20*    (2006.01)
*H10D 86/40*   (2025.01)

(52) U.S. Cl.
CPC ............... *H10D 86/60* (2025.01); *G09G 3/20* (2013.01); *H10D 86/441* (2025.01); *G09G 2310/0297* (2013.01)

(58) Field of Classification Search
None
See application file for complete search history.

(56) References Cited

U.S. PATENT DOCUMENTS

2023/0215353 A1   7/2023   Zhang et al.

FOREIGN PATENT DOCUMENTS

| CN | 103927970 A | 7/2014 |
|----|-------------|--------|
| CN | 111292700 A | 6/2020 |

(Continued)

OTHER PUBLICATIONS

International Search Report in International application No. PCT/CN2023/118029, mailed on Oct. 28, 2023.

(Continued)

*Primary Examiner* — Nitin Patel
*Assistant Examiner* — Amen W Bogale
(74) *Attorney, Agent, or Firm* — PV IP PC; Wei Te Chung

(57) ABSTRACT

The present application provides a demultiplexing circuit, a control method thereof and a display device, which include at least one demultiplexing module and a switch control module. A compensation unit of each demultiplexing unit in the demultiplexing module is coupled to a voltage level of an output end of a data writing transistor according to a clock signal received by a control end of the data writing transistor. The output end of each switch control unit of the switch control module is electrically connected to the control end of the data writing transistor included in a demultiplexing unit.

18 Claims, 6 Drawing Sheets

(56) References Cited

FOREIGN PATENT DOCUMENTS

| | | | | |
|---|---|---|---|---|
| CN | 111429842 A | 7/2020 | | |
| CN | 114899194 A | 8/2022 | | |
| KR | 20140093357 A | * | 7/2014 | ........... G09G 3/3688 |
| WO | WO-2007069101 A1 | * | 6/2007 | ........... G09G 3/3688 |

OTHER PUBLICATIONS

Written Opinion of the International Search Authority in International application No. PCT/CN2023/118029, mailed on Oct. 28, 2023.

* cited by examiner

DEMULTIPLEXING CIRCUIT AND CONTROL METHOD THEREOF AND DISPLAY DEVICE

CROSS REFERENCE TO RELATED APPLICATIONS

This application claims the benefits of International Application No. PCT/CN2023/118029, filed Sep. 11, 2023, which claims priority to Chinese Application No. 202311133956.4, filled on Sep. 4, 2023. The entire disclosures of each of the applications are incorporated herein by reference.

TECHNICAL FIELD

The present application relates to display technologies, and more particularly to a demultiplexing circuit, a control method thereof and a display device.

BACKGROUND ARTS

Demultiplexers are widely applied in display devices because they can decompose one signal channel into multiple signal channels for output. A use of the demultiplexer can reduce the number of channels of display signals required by the display device, thereby reducing the number of data driver chips and reducing the manufacturing cost of the display device. However, since the demultiplexer needs to write more signals in the same time, the transistors responsible for writing the signals will be subject to a greater pressure on voltage and current. This accelerates the aging of the demultiplexer and causes a positive drift of the threshold voltage of the transistors, eventually leading to failure.

Technical Problems

Embodiments of the present application provide a demultiplexing circuit, a control method thereof, and a display device, which can improve the problem of a positive drift of the threshold voltage of a data writing transistor responsible for writing signals.

Technical Solutions

Embodiments of the present application provide a demultiplexing circuit including at least one demultiplexing module and a switch control module. Each demultiplexing module is electrically connected to an input signal line and a plurality of output signal lines, each demultiplexing module includes a plurality of demultiplexing units, each of the demultiplexing units includes a data writing transistor and a compensation unit electrically connected to the data writing transistor, an output end of the data writing transistor is electrically connected to a corresponding output signal line. The switch control module includes a plurality of switch control units electrically connected to a switch control line, in which each of the switch control units is electrically connected to a clock signal line, each of the switch control units has an output end electrically connected to a control end of the data writing transistor of one of the demultiplexing units. Each of the switch control units is configured to output the clock signal transmitted by the clock signal line to the control end of a corresponding demultiplexing unit according to a switch control signal transmitted by the switch control line, the compensation unit of each of the demultiplexing units is configured to detect a threshold voltage of the data writing transistor and receive a corresponding compensation control signal to compensate for the threshold voltage of the data writing transistor.

The embodiments of the present application further provide a control method for a demultiplexing circuit, in which the method is used to control any of the above-mentioned demultiplexing circuits and includes outputting, by the switch control module, the clock signal transmitted by the clock signal line to the control end of the data writing transistor included in the corresponding demultiplexing unit according to the switch control signal transmitted by the switch control line to reset the voltage level of the control end of the data writing transistor included in the corresponding demultiplexing unit; transmitting, by the switch control module, the clock signal to the control end of the data writing transistor included in the corresponding demultiplexing unit according to the switch control signal to detect the threshold voltage of the data writing transistor by the compensation unit included in the demultiplexing unit; and compensating, by the compensation unit of the demultiplexing unit, for the threshold voltage of the data writing transistor according to the corresponding compensation control signal.

The present application further provides a display device including any of the afore-described demultiplexing circuits.

Beneficial Effects

Compared with the existing arts, the embodiments of the present application provide a demultiplexing circuit, a control method thereof and a display device. The demultiplexing circuit includes at least one demultiplexing module and a switch control module. Each demultiplexing unit included in the demultiplexing module includes a data writing transistor. An output end of each switch control unit included in the switch control module is electrically connected to a control end of the data writing transistor included in the demultiplexing unit such that the switch control unit transmits a clock signal the control end of the data writing transistor included in a corresponding demultiplexing unit to reset the voltage level of the control end of the data writing transistor included in the corresponding demultiplexing unit. A compensation unit included in each demultiplexing unit couples the voltage level of the output end of the data writing transistor according to the clock signal received by the control end of the data writing transistor to detect the threshold voltage of the data writing transistor. Then, it is to compensate for the threshold voltage of the data writing transistor according to a corresponding compensation control signal. In this way, it is achieved the compensation from the inside for a drift of the threshold voltage of the data writing transistor, improving the problem of positive drift of the threshold voltage of the data writing transistor responsible for writing signals, and extending the operating life of the demultiplexing circuit.

DESCRIPTION OF EMBODIMENTS OF THE INVENTION

To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

Figure 1A:
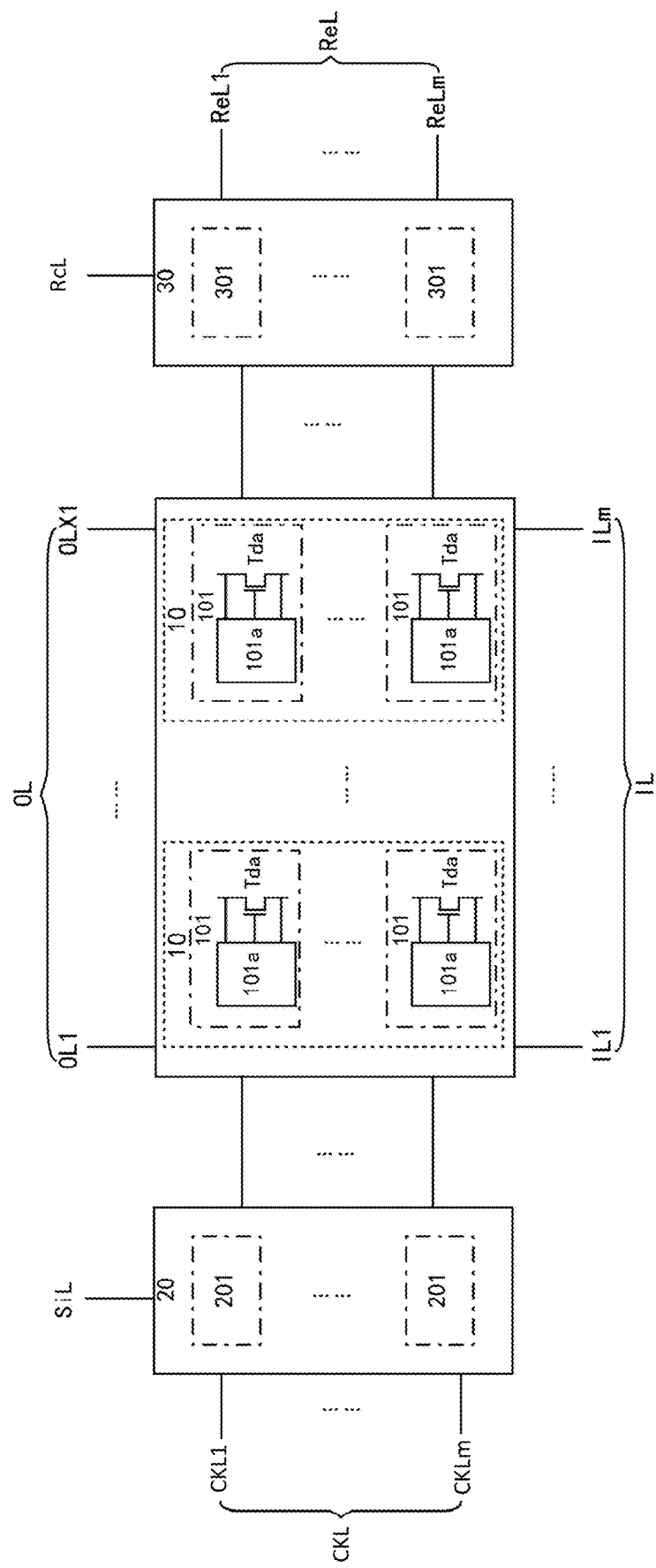
FIGS. 1A to 1C are schematic structural diagrams illustrating a demultiplexing circuit provided in an embodiment of the present application.
Figure 1B:
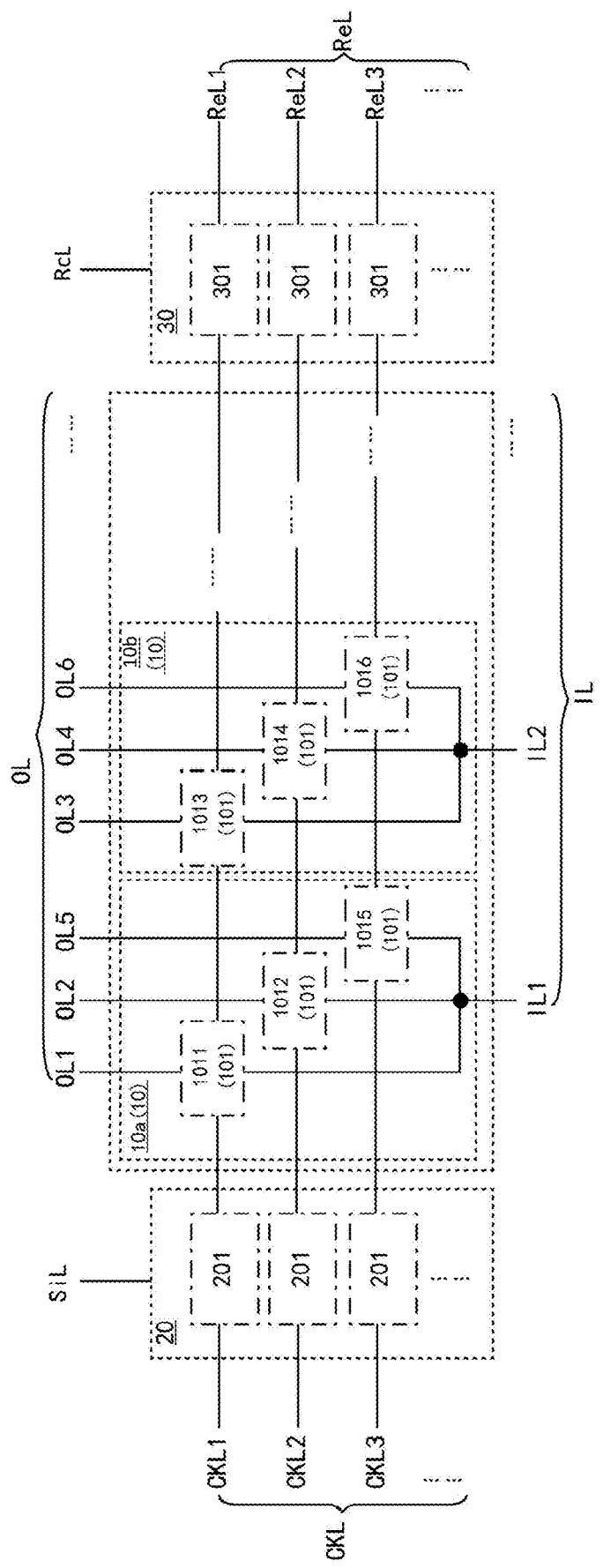
Figure 1C:
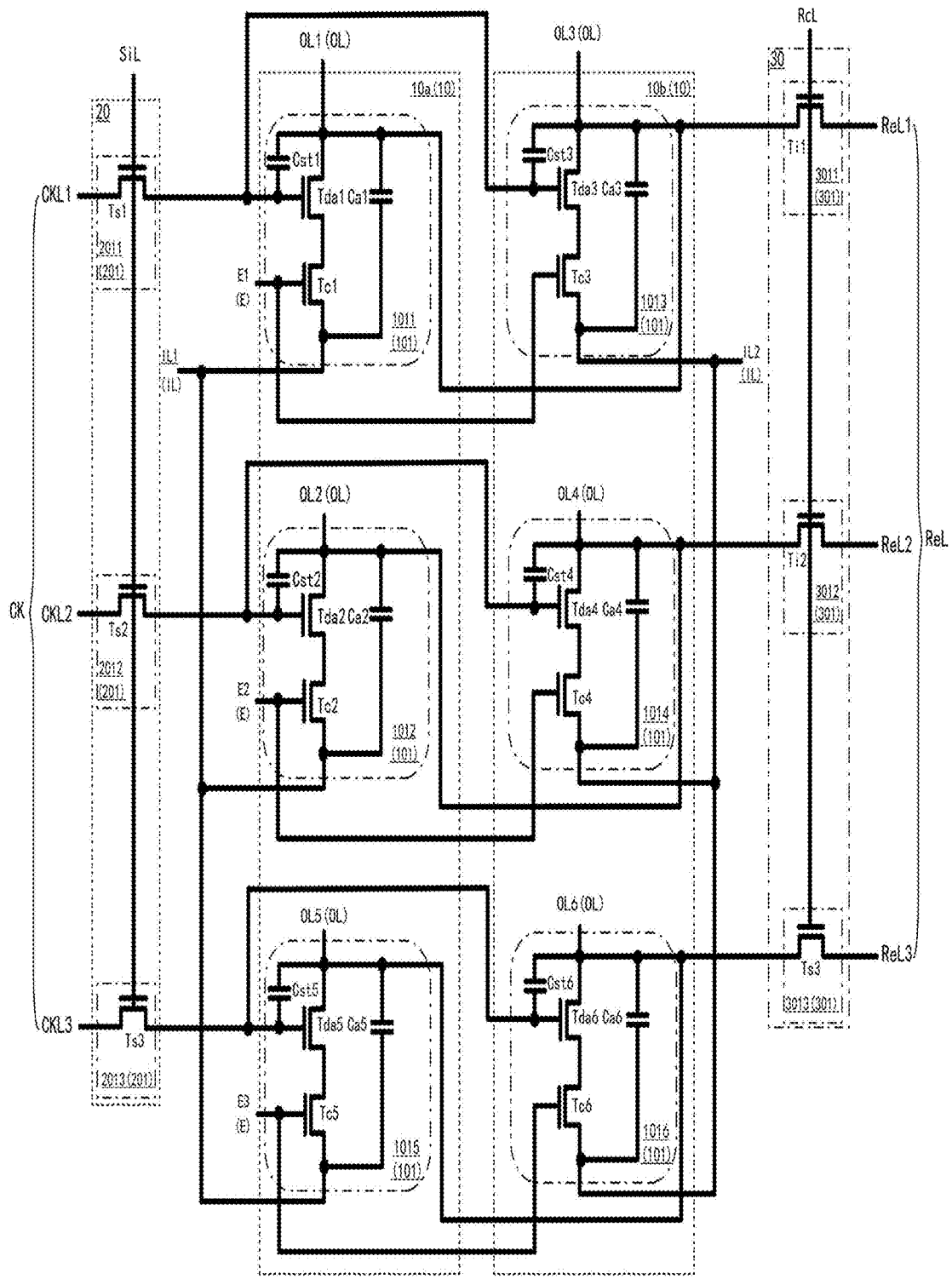

Specifically, FIG. 1A to FIG. 1C are schematic structural diagrams illustrating a demultiplexing circuit provided in an embodiment of the present application. The embodiments of the present application provide a demultiplexing circuit, which includes at least one demultiplexing module 10 and a switch control module 20.

Each demultiplexing module 10 is electrically connected to an input signal line IL and a plurality of output signal lines OL, and each demultiplexing module 10 is configured to convert one of input signals IS transmitted on the input signal line IL into a plurality of output signals, and the plurality of output signals are output via the plurality of output signal lines OL.

Each demultiplexing module 10 includes a plurality of demultiplexing units 101. Each of the demultiplexing units 101 includes a data writing transistor Tda and a compensation unit 101a electrically connected to the data writing transistor Tda. Optionally, an output end of the data writing transistor Tda is electrically connected to a corresponding output signal line OL.

The switch control module 20 includes a plurality of switch control units 201 electrically connected to a switch control line SiL. Each of the switch control units 201 is electrically connected to a clock signal line CKL. Each of the switch control units 201 has an output end electrically connected to one of the demultiplexing units 101. Each of the switch control units 201 of the switch control module 20 is configured to output the clock signal CK transmitted by the clock signal line CKL to a corresponding demultiplexing unit 101 according to a switch control signal Si transmitted by the switch control line SiL.

Optionally, the output end of each of the switch control units 201 is electrically connected to the control end of the data writing transistor Tda of one of the demultiplexing units 101 such that each of the switch control units 201 is configured to transmit the clock signal CK to the control end of a corresponding data writing transistor Tda according to the switch control signal Si, so as to reset a voltage level of the control end of the data writing transistor Tda by the clock signal CK. The compensation unit 101a of each of the demultiplexing units 101 is configured to couple to the voltage level of the output end of the data writing transistor Tda according to the clock signal CK received by the control end of the data writing transistor Tda, so as to detect the threshold voltage of the data writing transistor Tda and receive a corresponding compensation control signal E, thereby compensating the threshold voltage of the data writing transistor Tda according to the corresponding compensation control signal E and then realizing the compensation from an internal side for a drift of the threshold voltage of the data writing transistor Tda, improving the problem of a positive drift of the threshold voltage of the data writing transistor Tda responsible for writing signals, and extending the operating life of the demultiplexing circuit.

Please continue referring to FIG. 1A to FIG. 1C. Optionally, the compensation unit 101a includes a compensation transistor Tc and a first capacitor Cst.

The input end of the compensation transistor Tc is electrically connected to a corresponding input signal line IL, the output end of the compensation transistor Tc is electrically connected to the input end of the data writing transistor Tda, the control end of the compensation transistor Tc receives the corresponding compensation control signal E.

The first end of the first capacitor Cst is electrically connected to the control end of the data writing transistor Tda, the second end of the first capacitor Cst is electrically connected to the output end of the data writing transistor Tda.

The clock signal CK received by the control end of the data writing transistor Tda can be coupled to the output end of the data writing transistor Tda via the first capacitor Cst such that extraction of the threshold voltage of the data writing transistor Tda is achieved by using the clock signal CK and the compensation unit 101a, the threshold voltage of the data writing transistor Tda is stored by using the first capacitor Cst.

Please continue referring to FIG. 1A to FIG. 1C. Optionally, the switch control module 20 includes a switch transistor Ts. The control end of the switch transistor Ts is electrically connected to the switch control line SiL. The input end of the switch transistor Ts is electrically connected to a corresponding clock signal line CKL. The output end of the switch transistor Ts is electrically connected to the control end of the data writing transistor Tda of a corresponding demultiplexing unit 101.

Optionally, in order to accurately detect the threshold voltage of the data writing transistor Tda, the demultiplexing circuit further includes a voltage level reset module 30. The voltage level reset module 30 includes a plurality of voltage level reset units 301 electrically connected to a reset control line RcL. Each of the voltage level reset units 301 is electrically connected to a reset signal line ReL. The output end of each of the voltage level reset unit 301 is electrically connected to one of the demultiplexing units 101. Each of the voltage level reset units 301 of the voltage level reset module 30 is configured to output a reset signal Re transmitted by the reset signal line ReL to a corresponding demultiplexing unit 101 according to a reset control signal Rc transmitted by the reset control line RcL.

Optionally, the output end of each of the voltage level reset units 301 is electrically connected to the output end of the data writing transistor Tda of one of the demultiplexing units 101 such that each of the voltage level reset units 301 is configured to transmit the reset signal Re to the output end of a corresponding data writing transistor Tda to reset the voltage level of the output end of the data writing transistor Tda by using the reset signal Re. Then, it can have a more stable voltage level when the compensation unit 101a detects the threshold voltage of the data writing transistor Tda.

Please continue referring to FIG. 1A to FIG. 1C. Optionally, each of the voltage level reset units 301 includes a reset transistor T1. The control end of the reset transistor T1 is electrically connected to the reset control line RcL. The input end of the reset transistor T1 is electrically connected to a corresponding reset signal line ReL. The output end of the reset transistor T1 is electrically connected to the output end of the data writing transistor Tda of a corresponding demultiplexing unit 101.

Optionally, in order to improve the stability of the voltage level of the output end of the data writing transistor Tda, which will be affected by a change of the control end of the data writing transistor Tda, the demultiplexing circuit further includes a voltage level stabilizing unit. The voltage level stabilizing unit is electrically connected to the output end of the data writing transistor Tda to stabilize the voltage level of the output end of the data writing transistor Tda.

Please continue referring to FIG. 1A to FIG. 1C. Optionally, the voltage level stabilizing unit includes a second capacitor Ca. The first end of the second capacitor Ca is electrically connected to the output end of the data writing transistor Tda. The second end of the second capacitor Ca is electrically connected to a corresponding input signal line IL.

Please continue referring to FIG. 1A to FIG. 1C. Optionally, by taking one of the demultiplexing modules 10 including two demultiplexing units 101 for example, it will be illustrated the connections among the demultiplexing units 101, the switch control units 201 and the voltage level reset units 301.

The plurality of voltage level reset units 301 include a first reset unit 3011 and a second reset unit 3012 that are electrically connected to the reset control line RcL. The first reset unit 3011 is electrically connected to a first reset signal line ReL1. The second reset unit 3012 is electrically connected to a second reset signal line ReL2. The first reset signal line ReL1 transmits a first reset signal Re1. The second reset signal line ReL2 transmits a second reset signal Re2.

The plurality of switch control units 201 include a first switch control unit 2011 and a second switch control unit 2012 that are electrically connected to the switch control line SiL. The first switch control unit 2011 is electrically connected to a first clock signal line CKL1. The second switch control unit 2012 is electrically connected to a second clock signal line CKL2. The first clock signal line CKL1 transmits a first clock signal CK1. The second clock signal line CKL2 transmits a second clock signal CK2.

The demultiplexing module 10 includes a first demultiplexing module 10a. The plurality of demultiplexing units 101 included in the first demultiplexing module 10a include at least a first demultiplexing unit 1011 and a second demultiplexing unit 1012. The first demultiplexing unit 1011 is electrically connected to a first input signal line IL1 and a first output signal line OL1. The second demultiplexing unit 1012 is electrically connected to the first input signal line IL1 and a second output signal line OL2. The first input signal line IL1 transmits a first input signal IS1. The first output signal line OL1 transmits a first output signal. The second output signal line OL2 transmits a second output signal.

Optionally, the first demultiplexing unit 1011 is electrically connected between the output end of the first switch control unit 2011 and the output end of the first reset unit 3011. The compensation unit 101a of the first demultiplexing unit 1011 is configured to receive a first compensation control signal E1. The second demultiplexing unit 1012 is electrically connected between the output end of the second switch control unit 2012 and the output end of the second reset unit 3012. The compensation unit 101a of the second demultiplexing unit 1012 is configured to receive a second compensation control signal E2.

Optionally, the input end of the switch transistor Ts1 included in the first switch control unit 2011 is electrically connected to the first clock signal line CKL1. The output end of the switch transistor Ts1 included in the first switch control unit 2011 is electrically connected to the output end of the first switch control unit 2011. The input end of the reset transistor Ti1 included in the first reset unit 3011 is electrically connected to the first reset signal line ReL1. The output end of the reset transistor Ti1 included in the first reset unit 3011 is electrically connected to the output end of the first reset unit 3011. The control end of the data writing transistor Tda1 included in the first demultiplexing unit 1011 is electrically connected to the output end of the first switch control unit 2011. The output end of the data writing transistor Tda1 of the first demultiplexing unit 1011 is electrically connected to the output end of the first reset unit 3011.

The input end of the switch transistor Ts2 included in the second switch control unit 2012 is electrically connected to the second clock signal line CKL2. The output end of the switch transistor Ts2 included in the second switch control unit 2012 is electrically connected to the output end of the second switch control unit 2012. The input end of the reset transistor Ti2 included in the second reset unit 3012 is electrically connected to the second reset signal line ReL2. The output end of the reset transistor Ti2 included in the second reset unit 3012 is electrically connected to the output end of the second reset unit 3012. The control end of the data writing transistor Tda2 included in the second demultiplexing unit 1012 is electrically connected to the output end of the second switch control unit 2012. The output end of the data writing transistor Tda2 of the second demultiplexing unit 1012 is electrically connected to the output end of the second reset unit 3012.

Optionally, in each device with the demultiplexing circuit applied, there may be application scenarios in which the input signals IS are different, but multiple output signals need to be output at the same time. For example, when the demultiplexing circuit is applied to a display device, the required data signals by multiple sub-pixels located in the same row may be different from each other, but the multiple sub-pixels located in the same row may need to be controlled in the same time period to realize the image displaying. As a result, the demultiplexing circuit should be able to meet the requirements in which multiple output signals are simultaneously output in the same time period based on different input signals IS for multiple sub-pixels located at the same row. Therefore, in order for the demultiplexing circuit to output multiple output signals in the same time period based on different input signals IS, the demultiplexing circuit may include a plurality of demultiplexing modules 10. The plurality of demultiplexing modules 10 are electrically connected between the switch control module 20 and the voltage level reset module 30.

By taking the demultiplexing circuit including two demultiplexing modules 10 for example, it will be illustrated detailed connections and structures of the plurality of demultiplexing modules 10.

Specifically, please continue referring to FIG. 1A to FIG. 1C. The demultiplexing modules 10 include a first demultiplexing module 10a and a second demultiplexing module 10b.

The plurality of demultiplexing units 101 included in the second demultiplexing module 10b include at least a third demultiplexing unit 1013 and a fourth demultiplexing unit 1014. The third demultiplexing unit 1013 is electrically connected to a second input signal line IL2 and a third output signal line OL3. The fourth demultiplexing unit 1014 is electrically connected to the second input signal line IL2 and a fourth output signal line OL4. The second input signal line IL2 transmits a second input signal IS2. The third output signal line OL3 transmits a third output signal. The fourth output signal line OL4 transmits a fourth output signal.

Optionally, the third demultiplexing unit 1013 is electrically connected between the output end of the first switch control unit 2011 and the output end of the first reset unit 3011. The compensation unit 101a of the third demultiplexing unit 1013 is configured to receive the first compensation control signal E1. The fourth demultiplexing unit 1014 is electrically connected between the output end of the second switch control unit 2012 and the output end of the second reset unit 3012. The compensation unit 101a of the fourth demultiplexing unit 1014 is configured to receive the second compensation control signal E2.

Specifically, the control end of the data writing transistor Tda3 included in the third demultiplexing unit 1013 is electrically connected to the output end of the first switch control unit 2011 such that the control end of the data writing transistor Tda1 included in the first demultiplexing unit 1011 is electrically connected to the control end of the data writing transistor Tda3 included in the third demultiplexing unit 1013. In this way, the first switch control unit 2011 transmits the first clock signal CK1 simultaneously to the control end of the data writing transistor Tda1 included in the first demultiplexing unit 1011 and the control end of the data writing transistor Tda3 included in the third demultiplexing unit 1013 such that the data writing transistor Tda1 included in the first demultiplexing unit 1011 and the data writing transistor Tda3 included in the third demultiplexing unit 1013 are turned on or turned off simultaneously.

The output end of the data writing transistor Tda3 included in the third demultiplexing unit 1013 is electrically connected to the output end of the first reset unit 3011 such that the output end of the data writing transistor Tda1 included in the first demultiplexing unit 1011 is electrically connected to the output end of the data writing transistor Tda3 included in the third demultiplexing unit 1013. In this way, the first voltage level reset unit 301 transmits the first reset signal Re1 simultaneously to the output end of the data writing transistor Tda1 included in the first demultiplexing unit 1011 and the output end of the data writing transistor Tda3 included in the third demultiplexing unit 1013 such that the voltage level of the output end of the data writing transistor Tda1 included in the first demultiplexing unit 1011 and the voltage level of the output end of the data writing transistor Tda3 included in the third demultiplexing unit 1013 are reset at the same time.

The control end of the data writing transistor Tda4 included in the fourth demultiplexing unit 1014 is electrically connected to the output end of the second switch control unit 2012 such that the control end of the data writing transistor Tda2 included in the second demultiplexing unit 1012 is electrically connected to the control end of the data writing transistor Tda4 included in the fourth demultiplexing unit 1014. In this way, the second switch control unit 2012 transmits the second clock signal CK2 simultaneously to the control end of the data writing transistor Tda2 included in the second demultiplexing unit 1012 and the control end of the data writing transistor Tda4 included in the fourth demultiplexing unit 1014 such that the data writing transistor Tda2 included in the second demultiplexing unit 1012 and the data writing transistor Tda4 included in the fourth demultiplexing unit 1014 are turned on or turned off simultaneously.

The output end of the data writing transistor Tda4 included in the fourth demultiplexing unit 1014 is electrically connected to the output end of the second reset unit 3012 such that the output end of the data writing transistor Tda4 included in the fourth demultiplexing unit 1014 is electrically connected to the output end of the data writing transistor Tda2 included in the second demultiplexing unit 1012. In this way, the second voltage level reset unit 301 transmits the second reset signal Re2 simultaneously to the output end of the data writing transistor Tda2 included in the second demultiplexing unit 1012 and the output end of the data writing transistor Tda4 included in the fourth demultiplexing unit 1014 such that the voltage level of the output end of the data writing transistor Tda2 included in the second demultiplexing unit 1012 and the voltage level of the output end of the data writing transistor Tda4 included in the fourth demultiplexing unit 1014 are reset at the same time.

By making the first demultiplexing unit 1011 and the third demultiplexing unit 1013 receive the first clock signal CK1 and the first reset signal Re1 simultaneously, both the first demultiplexing unit 1011 and the third demultiplexing unit 1013 can realize the detection on the threshold voltage and the voltage level resetting of the control end and output end of the data writing transistor Tda. By making the second demultiplexing unit 1012 and the fourth demultiplexing unit 1014 receive the second clock signal CK2 and the second reset signal Re2 simultaneously, both the second demultiplexing unit 1012 and the fourth demultiplexing unit 1014 can realize the detection on the threshold voltage and the voltage level resetting of the control end and output end of the data writing transistor Tda. By making the first demultiplexing unit 1011 and the second demultiplexing unit 1012 share the first input signal IS1 and making the third demultiplexing unit 1013 and the fourth demultiplexing unit 1014 share the second input signal IS2, it enables the first input signal IS1 to be decomposed into the first output signal and the second output signal via the first demultiplexing unit 1011 and the second demultiplexing unit 1012 and enables the second input signal IS2 to be decomposed into the third output signal and the fourth output signal via the third demultiplexing unit 1013 and the fourth demultiplexing unit 1014. By making the first demultiplexing unit 1011 and the third demultiplexing unit 1013 share the first compensation control signal E1 and making the second demultiplexing unit 1012 and the fourth demultiplexing unit 1014 share the first compensation control signal E1, it enables the first output signal and the third output signal to be output in the same time period and enables the second output signal and the fourth output signal to be output in the same time period.

It can be understood that in this application, it is illustrated by taking the demultiplexing circuit including two demultiplexing modules 10 and the demultiplexing module 10 including two demultiplexing units 101 as an example to describe the connection between the demultiplexing modules 10 and the connection between the demultiplexing units 101; however, the application is not limited by the number of the demultiplexing modules 10 included in the demultiplexing circuit and the number of the demultiplexing units 101 included in the demultiplexing module 10.

That is, the demultiplexing circuit may include m demultiplexing modules 10, and each of the demultiplexing modules 10 may include n demultiplexing units 101. m≥2, and n≥2.

If the demultiplexing circuit further includes a third demultiplexing module 10. The plurality of demultiplexing units 101 included in the first demultiplexing module 10a further include a fifth demultiplexing unit 1015, and the plurality of demultiplexing units 101 included in the second demultiplexing module 10*b* further include a sixth demultiplexing unit 1016. Correspondingly, the plurality of reset units 301 further include a third reset unit 3013 electrically connected to the reset control line RcL, and the third reset unit 3013 is electrically connected to a third reset signal line ReL3. The plurality of switch control units 201 further include a third switch control unit 2013 electrically connected to the switch control line SiL, and the third switch control unit 2013 is electrically connected to a third clock signal line CKL3.

The compensation units 101*a* of the fifth demultiplexing unit 1015 and the sixth demultiplexing unit 1016 are configured to receive a third compensation control signal E3. The input end of the switch transistor Ts3 included in the third switch control unit 2013 is electrically connected to the third clock signal line CKL3. The output end of the switch transistor Ts3 included in the third switch control unit 2013 is electrically connected to the output end of the third switch control unit 2013. The input end of the reset transistor Ti3 included in the third reset unit 3013 is electrically connected to the third reset signal line ReL3. The output end of the reset transistor Ti3 included in the third reset unit 3013 is electrically connected to the output end of the third reset unit 3013. The control end of the data writing transistor Tda5 included in the fifth demultiplexing unit 1015 and the control end of the data writing transistor Tda6 included in the sixth demultiplexing unit 1016 are electrically connected to the output end of the third switch control unit 2013. The output end of the data writing transistor Tda5 included in the fifth demultiplexing unit 1015 and the output end of the data writing transistor Tda6 included in the sixth demultiplexing unit 1016 are electrically connected to the output end of the third reset unit 3013.

Optionally, the number of the demultiplexing units 101 and the number of the demultiplexing modules 10 included in the demultiplexing circuit may be determined by taking each device with the demultiplexing circuit applied into consideration.

If the demultiplexing circuit is applied to a display device, the number of the demultiplexing units 101 and the number of the demultiplexing modules 10 included in the demultiplexing circuit can be determined based on the arrangement of pixels in the display panel.

Optionally, in the display device with the demultiplexing circuit applied, each row includes X pixels, and each pixel includes Y sub-pixels. Then, the demultiplexing circuit may include X1 demultiplexing modules 10, and each of the demultiplexing modules 10 may include Y1 demultiplexing units 101. X>1, Y>1, X1≤X, and Y1≤Y. X1<X corresponds to a situation where one demultiplexing module 10 is shared by multiple pixels to output a plurality of output signals; and Y1<Y corresponds to a situation where one demultiplexing unit 101 is shared by multiple sub-pixels to output the output signals.

Optionally, each pixel includes 3 sub-pixels, and each of demultiplexing modules 10 may include the demultiplexing units 101 whose number corresponds to the number of sub-pixels (that is, each of the demultiplexing modules 10 may include 3 demultiplexing units 101). For example, the first demultiplexing module 10*a* includes the first demultiplexing unit 1011, the second demultiplexing unit 1012 and the fifth demultiplexing unit 1015, and the second demultiplexing module 10*b* includes the third demultiplexing unit 1013, the fourth demultiplexing unit 1014 and the sixth demultiplexing unit 1016 such that the first demultiplexing unit 1011, the second demultiplexing unit 1011 and the fifth demultiplexing unit 1016 provide the output signals for three sub-pixels, respectively, and third demultiplexing unit 1013, the fourth demultiplexing unit 1014 and the sixth demultiplexing unit 1016 provide the output signals for three sub-pixels, respectively.

Optionally, the first demultiplexing module 10*a* and the second demultiplexing module 10*b* may be configured to provide the output signals for the sub-pixels included in different pixels.

Figure 2:
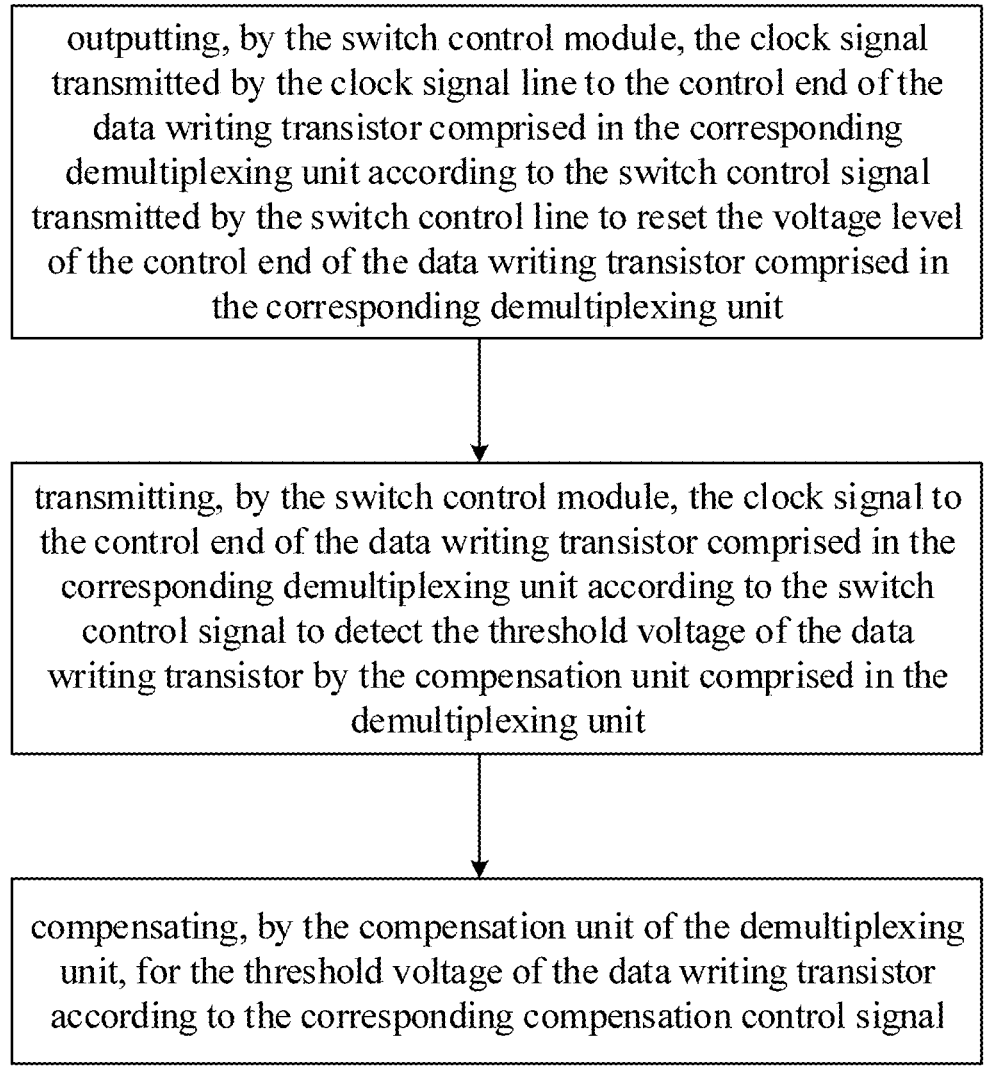
FIG. 2 is a flowchart of a control method for a demultiplexing circuit provided in an embodiment of the present application.

FIG. 2 is a flowchart of a control method for a demultiplexing circuit provided in an embodiment of the present application. The embodiments of the present application further provide a demultiplexing circuit control method, which is used to control any of the above-mentioned demultiplexing circuits. The demultiplexing circuit control method includes the followings.

The switch control module 20 outputs the clock signal CK transmitted by the clock signal line CKL to the control end of the data writing transistor Tda included in the corresponding demultiplexing unit 101 according to the switch control signal Si transmitted by the switch control line SiL to reset the voltage level of the control end of the data writing transistor Tda included in the corresponding demultiplexing unit 101.

The switch control module fuzzy 20 transmits the clock signal CK to the control end of the data writing transistor Tda included in the corresponding demultiplexing unit 101 according to the switch control signal Si to detect the threshold voltage of the data writing transistor Tda by the compensation unit 101*a* included in the demultiplexing unit 101.

The compensation unit 101*a* of the demultiplexing unit 101 compensates for the threshold voltage of the data writing transistor Tda according to the corresponding compensation control signal E.

Figure 3:
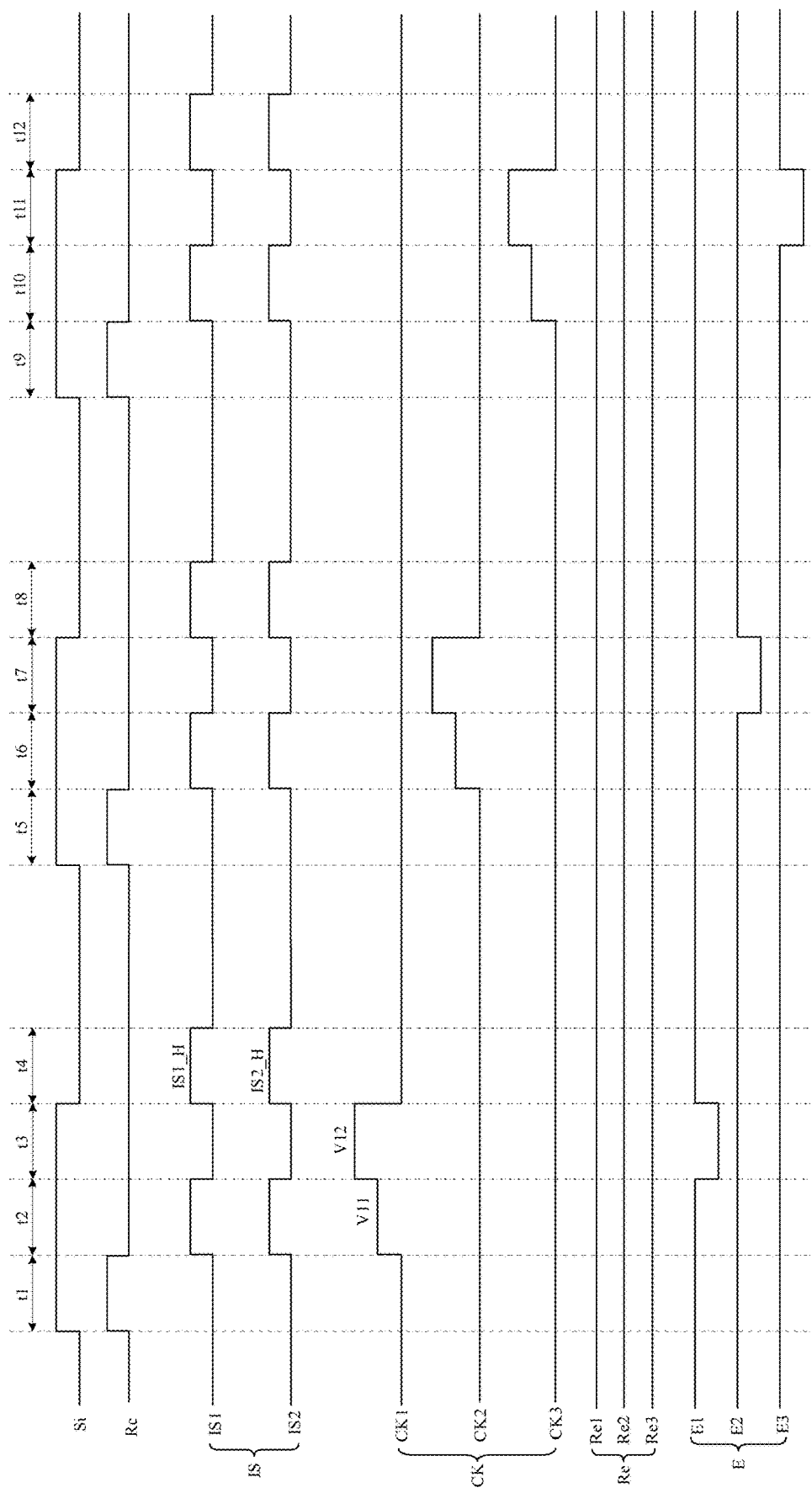
FIG. 3 is a timing diagram of a demultiplexing circuit provided in an embodiment of the present application.

FIG. 3 is a timing diagram of a demultiplexing circuit provided in an embodiment of the present application. By taking an example, that is, the demultiplexing circuit includes the first demultiplexing module 10*a* and the second demultiplexing module 10*b*, the first demultiplexing module 10*a* includes the first demultiplexing unit 1011, the second demultiplexing unit 1012 and the fifth demultiplexing unit 1015, the second demultiplexing module 10*b* includes the third demultiplexing unit 1013, the fourth demultiplexing unit 1014 and the sixth demultiplexing unit 1016, and all of the switch transistor Ts, the reset transistor T1, the data writing transistor Tda and the compensation transistors Tc are N-type transistors, it will be illustrated the control method for the demultiplexing circuit as follows.

First stage t1: the switch control signal Si, the reset control signal Rc, the first compensation control signal E1, the second compensation control signal E2 and the third compensation control signal E3 are at high voltage level; and the first clock signal CK1, the second clock signal CK2, the third clock signal CK3, the first input signal IS1, the second input signal IS2, the first reset signal Re1, the second reset signal Re2 and the third reset signal Re3 are at low voltage level.

The switch transistors Ts1 to Ts3 included in the first switch control unit 2011 to the third switch control unit 2013 are turned on according to the switch control signal Si. The first clock signal CK1 is transmitted to the control ends of the data writing transistors Tda1 and Tda3 included in the first demultiplexing unit 1011 and the third demultiplexing unit 1013 via the switch transistor Ts1 included in the first switch control unit 2011, the second clock signal CK2 is transmitted to the control ends of the data writing transistors Tda2 and Tda4 included in the second demultiplexing unit 1012 and the fourth demultiplexing unit 1014 via the switch transistor Ts2 included in the second switch control unit 2012, and the third clock signal CK3 is transmitted to the control ends of the data writing transistors Tda5 and Tda6 included in the fifth demultiplexing unit 1015 and the sixth demultiplexing unit 1016 via the switch transistor Ts3 included in the third switch control unit 2013. In this way, the first clock signal CK1 resets the voltage level of the control ends of the data writing transistors Tda1 and Tda3 included in the first demultiplexing unit 1011 and the third demultiplexing unit 1013, the second clock signal CK2 resets the voltage level of the control ends of the data writing transistors Tda2 and Tda4 included in the second demultiplexing unit 1012 and the fourth demultiplexing unit 1014, and the third clock signal CK3 resets the voltage level of the control ends of the data writing transistors Tda5 and Tda6 included in the fifth demultiplexing unit 1015 and the sixth demultiplexing unit 1016.

The reset transistors Ti1 to Ti3 included in the first reset unit 3011 to the third reset unit 3013 are turned on according to the reset control signal Rc. The first reset signal Re1 is transmitted to the output ends of the data writing transistors Tda1 and Tda3 included in the first demultiplexing unit 1011 and the third demultiplexing unit 1013 via the reset transistor Ti1 included in the first reset unit 3011, the second reset signal Re2 is transmitted to the output ends of the data writing transistors Tda2 and Tda4 included in the second demultiplexing unit 1012 and the fourth demultiplexing unit 1014 via the reset transistor Ti2 included in the second reset unit 3012, and the third reset signal Re3 is transmitted to the output ends of the data writing transistors Tda5 and Tda6 included in the fifth demultiplexing unit 1015 and the sixth demultiplexing unit 1016 via the reset transistor Ti3 included in the third reset unit 3013. In this way, the first reset signal Re1 resets the voltage level of the output ends of the data writing transistors Tda1 and Tda3 included in the first demultiplexing unit 1011 and the third demultiplexing unit 1013, the second reset signal Re2 resets the voltage level of the output ends of the data writing transistors Tda2 and Tda4 included in the second demultiplexing unit 1012 and the fourth demultiplexing unit 1014, and the third reset signal Re3 resets the voltage level of the output ends of the data writing transistors Tda5 and Tda6 included in the fifth demultiplexing unit 1015 and the sixth demultiplexing unit 1016.

The compensation transistors Tc1 and Tc3 included in the first demultiplexing unit 1011 and the third demultiplexing unit 1013 are turned on according to the first compensation control signal E1, the compensation transistors Tc2 and Tc4 included in the second demultiplexing unit 1012 and the fourth demultiplexing unit 1014 are turned on according to the second compensation control signal E2, and the compensation transistors Tc5 and Tc6 included in the fifth demultiplexing unit 1015 and the sixth demultiplexing unit 1016 are turned on according to the third compensation control signal E3. The first input signal IS1 is transmitted to the input ends of corresponding data writing transistors Td1, Td2 and Td5 via the compensation transistors Tc1, Tc2 and Tc5 included in the first demultiplexing unit 1011, the second demultiplexing unit 1012 and the fifth demultiplexing unit 1015, and the second input signal IS2 is transmitted to the input ends of corresponding data writing transistors Td3, Td4 and Td6 via the compensation transistors Tc3, Tc4 and Tc6 included in the third demultiplexing unit 1013, the fourth demultiplexing unit 1014 and the sixth demultiplexing unit 1016.

Second stage t2: the switch control signal Si, the first compensation control signal E1, the second compensation control signal E2, the third compensation control signal E3, the first input signal IS1 and the second input signals IS2 are at high voltage level. The reset control signal Rc, the second clock signal CK2, the third clock signal CK3, the first reset signal Re1, the second reset signal Re2 and the third reset signal Re3 are at low voltage level. The first clock signal CK1 has a first voltage value V11.

The switch transistors Ts1 to Ts3 included in the first switch control unit 2011 to the third switch control unit 2013 keep turned on. The first clock signal CK1 is transmitted to the control ends of the data writing transistors Tda1 and Tda3 included in the first demultiplexing unit 1011 and the third demultiplexing unit 1013. The compensation transistors Tc1 to Tc6 included in the first demultiplexing unit 1011 to the sixth demultiplexing unit 1016 keep turned on. The first input signal IS1 outputs to the input ends of the data writing transistors Td1, Td2 and Td5 included in the first demultiplexing unit 1011, the second demultiplexing unit 1012 and the fifth demultiplexing unit 1015. The second input signal IS2 outputs to the input ends of the data writing transistors Td3, Td4 and Td6 included in the third demultiplexing unit 1013, the fourth demultiplexing unit 1014 and the sixth demultiplexing unit 1016. In this way, the voltage level of the control ends of the data writing transistors Tda1 and Tda3 included in the first demultiplexing unit 1011 and the third demultiplexing unit 1013 is the first voltage value V11 (i.e., $Vg\_Tda1=Vs\_Tda3=V11$). The voltage level of the output end of the data writing transistor Tda1 included in the first demultiplexing unit 1011 is the different between the first voltage value V11 and the threshold voltage Vth_Tda1 of the data writing transistor Tda1 (i.e., $Vs\_Tda1=V11-Vth\_Tda1$). The voltage level of the output end of the data writing transistor Tda3 included in the third demultiplexing unit 1013 is the difference between the first voltage value V11 and the threshold voltage Vth_Tda3 of the data writing transistor Tda3 (i.e., $Vs\_Tda3=V11-Vth\_Tda3$). The first capacitors Cst included in the first demultiplexing unit 1011 and the third demultiplexing unit 1013 store the threshold voltage of corresponding data writing transistors Tda. Vg_Tda1 represents the voltage level of the control end of the data writing transistor Tda1, and Vg_Tda3 represents the voltage level of the control end of the data writing transistor Tda3. Vs_Tda1 represents the voltage level of the output end of the data writing transistor Tda1, and Vs_Tda3 represents the voltage level of the output end of the data writing transistor Tda3.

The data writing transistors Tda2 and Tda4 included in the second demultiplexing unit 1012 and the fourth demultiplexing unit 1014 are turned off according to the second clock signal CK2, and the data writing transistors Tda5 and Tda6 included in the fifth demultiplexing unit 1015 and the sixth demultiplexing unit 1016 are turned off according to the third clock signal CK3. The reset transistors Ti1 to Ti3 included in the first reset unit 3011 to the third reset unit 3013 are turned off according to the reset control signal Rc.

Third stage t3: the switch control signal Si, the second compensation control signal E2 and the third compensation control signal E3 are at high voltage level. The reset control signal Rc, the first input signal IS1, the second input signal IS2, the first compensation control signal E1, the second clock signal CK2, the third clock signal CK3, the first reset signal Re1, the second reset signal Re2 and the third reset signal Re3 are at low voltage level. The first clock signal CK1 has a second voltage value V12, and the second voltage value V12 is greater than the first voltage value V11.

The switch transistors Ts1 to Ts3 included in the first switch control unit 2011 to the third switch control unit 2013 keep turned on. The first clock signal CK1 is transmitted to the control ends of the data writing transistors Tda1 and Tda3 included in the first demultiplexing unit 1011 and the third demultiplexing unit 1013. The compensation transistors Tc1 and Tc3 included in the first demultiplexing unit 1011 and the third demultiplexing unit 1013 are turned off according to the first compensation control signal E1. The compensation transistors Tc2, Tc4, T5 and T6 included in the second demultiplexing unit 1012, the fourth demultiplexing unit 1014, the fifth demultiplexing unit 1015 and the sixth demultiplexing unit 1016 keep turned on. The first input signal IS1 outputs to the input ends of the data writing transistors Tda2 and Tda5 included in the second demultiplexing unit 1012 and the fifth demultiplexing unit 1015. The second input signal IS2 outputs to the input ends of the data writing transistors Tda4 and Tda6 included in the fourth demultiplexing unit 1014 and the sixth demultiplexing unit 1016. In this way, the voltage level of the control ends of the data writing transistors Tda1 and Tda3 included in the first demultiplexing unit 1011 and the third demultiplexing unit 1013 is the second voltage value V12. The voltage level of the output end of the data writing transistor Tda1 included in the first demultiplexing unit 1011 is $Vs\_Tda1=V11-Vth\_Tda1+(V12\ V11)\cdot Cst1/(Cst1+Ca1)$. The voltage level of the output end of the data writing transistor Tda3 included in the third demultiplexing unit 1013 is $Vs\_Tda3=V11-Vth\_Tda3+(V12-V11)\cdot Cst3/(Cst3+Ca3)$. In this way, the voltage difference between the control end and the output end of the data writing transistor Tda1 included in the first demultiplexing unit 1011 is $Vgs\_Tda1=(V12-V11)\cdot Ca1/(Cst1+Ca1)+Vth\_Tda1$. The voltage difference between the control end and the output end of the data writing transistor Tda3 included in the third demultiplexing unit 1013 is $Vgs\_Tda3=(V12-V11)\cdot Ca3/(Cst3+Ca3)+Vth\_Tda3$.

The data writing transistors Tda2 and Tda4 included in the second demultiplexing unit 1012 and the fourth demultiplexing unit 1014 are turned off according to the second clock signal CK2, and the data writing transistors Tda5 and Tda6 included in the fifth demultiplexing unit 1015 and the sixth demultiplexing unit 1016 are turned off according to the third clock signal CK3. The reset transistors Ti1 to Ti3 included in the first reset unit 3011 to the third reset unit 3013 are turned off according to the reset control signal Rc.

Fourth stage t4: the first input signal IS1, the second input signal IS2, the first compensation control signal E1, the second compensation control signal E2 and the third compensation control signal E3 are at high voltage level. The switch control signal Si, the reset control signal Rc, the first clock signal CK1, the second clock signal CK2, the third clock signal CK3, the first rest signal Re1, the second reset signal Re2 and the third reset signal Re3 are at low voltage level.

The switch transistors Ts1 to Ts3 included in the first switch control unit 2011 to the third switch control unit 2013 are turned off. The first compensation control signal E1 causes the compensation transistors Tc1 and Tc3 included in the first demultiplexing unit 1011 and the third demultiplexing unit 1013 to be turned on. The first input signal IS1 with a voltage value IS1_H outputs to the first output signal line OL1 via the compensation transistor Tc1 and the data writing transistor Tda1 included in the first demultiplexing unit 1011. The second input signal IS2 with a voltage value IS2_H outputs to the third output signal line OL3 via the compensation transistor Tc3 and the data writing transistor Tda3 included in the third demultiplexing unit 1013.

Because in the third stage t3, the voltage difference between the control end and the output end of the data writing transistor Tda1 included in the first demultiplexing unit 1011 is $Vgs\_Tda1=(V12-V11)\cdot Ca1/(Cst1+Ca1)+Vth\_Tda1$, the current flowing through the data writing transistor Tda1 included in the first demultiplexing unit 1011 in the fourth stage t4 is: $I\_Tda1=C_{ox}\mu_n W(Vgs-Vth\_Tda1)^2/2L=C_{ox}\mu_n W((V12-V11)\cdot Ca1/(Cst1+Ca1))^2/2L$.

Similarly, in the fourth stage t4, the current flowing through the data writing transistor Tda3 included in the third demultiplexing unit 1013 is: $I\_Tda3=C_{ox}\mu_n W((V12-V11)\cdot Ca3/(Cst3+Ca3))^2/2L$. Therefore, the current flowing through the data writing transistors Tda included in the first demultiplexing unit 1011 and the third demultiplexing unit 1013 is no longer affected by the threshold voltage of the data writing transistor Tda. $C_{ox}$, $\mu_n$, W and L represent channel capacitance per unit area, channel mobility, channel width and channel length.

It is achieved in the first stage t1 the resetting of voltage level of the control ends and the output ends of the data writing transistors Tda1 and Tda3 included in the first demultiplexing unit 1011 and the third demultiplexing unit 1013. It is achieved in the second stage t2 the detection on the threshold voltage of the data writing transistors Tda1 and Tda3 included in the first demultiplexing unit 1011 and the third demultiplexing unit 1013. It is achieved in the third stage t3 the compensation for the threshold voltage of the data writing transistors Tda1 and Tda3 included in the first demultiplexing unit 1011 and the third demultiplexing unit 1013. It is achieved in the fourth stage t4 outputting the signal transmitted by the first input signal line IL1 to the first output signal line OL1 via the first demultiplexing unit 1011 and outputting the signal transmitted by the second input signal line IL2 to the third output signal line OL3 via the third demultiplexing unit 1013.

Similarly, it can be achieved in a fifth stage t5 the resetting of voltage level of the control ends and the output ends of the data writing transistors Tda2 and Tda4 included in the second demultiplexing unit 1012 and the fourth demultiplexing unit 1014. It can be achieved in a sixth stage t6 the detection on the threshold voltage of the data writing transistors Tda2 and Tda4 included in the second demultiplexing unit 1012 and the fourth demultiplexing unit 1014. It can be achieved in a seventh stage t7 the compensation for the threshold voltage of the data writing transistors Tda2 and Tda4 included in the second demultiplexing unit 1012 and the fourth demultiplexing unit 1014. It can be achieved in an eighth stage t8 outputting the signal transmitted by the first input signal line IL1 to the second output signal line OL2 via the second demultiplexing unit 1012 and outputting the signal transmitted by the second input signal line IL2 to the fourth output signal line OL4 via the fourth demultiplexing unit 1014.

Similarly, it can be achieved in a ninth stage t9 the resetting of voltage level of the control ends and the output ends of the data writing transistors Tda5 and Tda6 included in the fifth demultiplexing unit 1015 and the sixth demultiplexing unit 1016. It can be achieved in a tenth stage t10 the detection on the threshold voltage of the data writing transistors Tda5 and Tda6 included in the fifth demultiplexing unit 1015 and the sixth demultiplexing unit 1016. It can be achieved in an eleventh stage t11 the compensation for the threshold voltage of the data writing transistors Tda5 and Tda6 included in the fifth demultiplexing unit 1015 and the sixth demultiplexing unit 1016. It can be achieved in a twelfth stage t12 outputting the signal transmitted by the first input signal line IL1 to the fifth output signal line OL5 via the fifth demultiplexing unit 1015 and outputting the signal transmitted by the second input signal line IL2 to the sixth output signal line OL6 via the sixth demultiplexing unit 1016.

Figure 4:
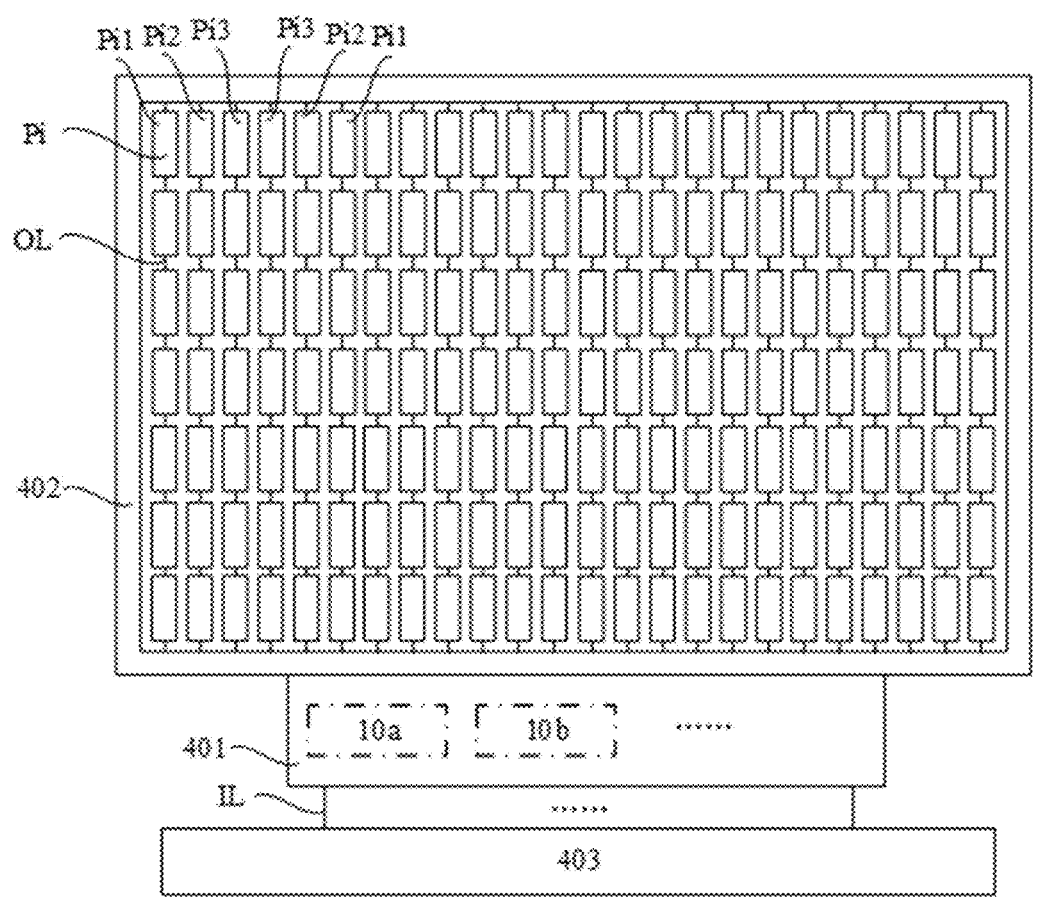
FIG. 4 is a schematic structural diagram illustrating a display device provided in an embodiment of the present application.

FIG. 4 is a schematic structural diagram illustrating a display device provided in an embodiment of the present application. The present application further provides a display device, which includes any of the above-mentioned demultiplexing circuits (as shown in 401 in FIG. 4).

Optionally, the display device further includes a driving module 403 and a display panel 402 electrically connected to the demultiplexing circuit.

Optionally, the display panel 402 includes a passive light-emitting display panel (such as a liquid crystal display panel), a self-luminous display panel (such as a display panel including organic light-emitting diodes, sub-millimeter light-emitting diodes, micro light-emitting diodes or other light-emitting components).

The display panel 402 includes a plurality of sub-pixels Pi and the plurality of output signal lines OL electrically connected to the plurality of sub-pixels Pi.

Optionally, the display panel 402 includes a plurality of pixels, and each of the pixels includes a plurality of sub-pixels Pi. Optionally, the number of the demultiplexing modules 10 included in the demultiplexing circuit 401 is smaller than the number of one row of pixels included in the display panel such that the output signals received by multiple pixels can be generated corresponding to one of demultiplexing modules 10 based on one of the input signals IS. Optionally, the number of the demultiplexing modules 10 included in the demultiplexing circuit 401 is equal to the number of one row of pixels included in the display panel such that the output signals received by each of the pixels are generated corresponding to one of demultiplexing modules 10 based on one of the input signals IS.

Optionally, the number of the demultiplexing units 101 included in the demultiplexing module 10 is smaller than the number of sub-pixels Pi included in the pixel such that at least a part of multiple sub-pixels Pi included in the pixel may receive the same output signal. Optionally, the number of the demultiplexing units 101 included in the demultiplexing module 10 is equal to the number of sub-pixels Pi included in the pixel such that multiple sub-pixels Pi included in the pixel may receive different output signals.

Optionally, the plurality of sub-pixels Pi include a first sub-pixel Pi1, a second sub-pixel Pi2 and a third sub-pixel Pi3 that illuminate with different colors and are arranged adjacently. Each of the pixels includes the first sub-pixel Pi1, the second sub-pixel Pi2 and the third sub-pixel Pi3. The first demultiplexing module 10a is electrically connected to a pixel, and the second demultiplexing module 10b is electrically connected to another pixel. Optionally, the first output signal line OL1 is electrically connected to the first sub-pixel Pi1 of a first pixel, the second output signal line OL2 is electrically connected to the second sub-pixel Pi2 of the first pixel, and the fifth output signal line OL5 is electrically connected to the third sub-pixel Pi3 of the first pixel. The third output signal line OL3 is electrically connected to the first sub-pixel Pi1 of a second pixel, the fourth output signal line OL4 is electrically connected to the second sub-pixel Pi2 of the second pixel, and the sixth output signal line OL6 is electrically connected to the third sub-pixel Pi3 of the second pixel.

Optionally, the output signal line OL includes a data line for transmitting data signals.

In addition, the output signal line OL may also be configured as a signal line to transmit scan signals, light emission control signals, reset signals, etc., as needed.

The driving module 403 is electrically connected to the demultiplexing circuit 401 via the input signal line IL, and the driving module 403 is configured to provide the input signal IS for the demultiplexing circuit via the input signal line IL.

Optionally, the driving module 403 includes a source driver chip. In addition, the driving module may also include a gate driver chip, a timing controller, etc.

Each of demultiplexing units 101 undergoes the resetting of the voltage level of the control end and the output end of the data writing transistor Tda, the detection on the threshold voltage, the compensation for the threshold voltage and the outputting of the input signal IS to the output signal line OL via the compensation transistor Tc and the data writing transistor Tda. This can enable the demultiplexing circuit 401 to automatically compensate from the inside for a drift of the threshold voltage of the data writing transistor Tda, caused by the pressure on voltage, current, etc., thereby extending the service life of the data writing transistor Tda and further extending the operating life of the demultiplexing circuit 401. In addition, since the demultiplexing circuit 401 can automatically compensate from the inside for the drift of the threshold voltage of the data writing transistor Tda caused by the pressure on voltage, current, etc., the output signals received by the plurality of sub-pixels Pi in the display panel will not be affected by the threshold voltage of the data writing transistor Tda. This can improve the problems of delays on signal writing and reduced charging rates in the display panel caused by the drift of the threshold voltage of the data writing transistor Tda and can reduce costs while extending the service life of the display device.

The principle and implementation of the present application are described herein through specific examples. The description about the embodiments of the present application is merely provided to help understanding the method and core ideas of the present application. In addition, persons of ordinary skill in the art can make variations and modifications to the present application in terms of the specific implementations and application scopes according to the ideas of the present application. Therefore, the content of specification shall not be construed as a limit to the present application.

The invention claimed is:

1. A demultiplexing circuit, comprising:
at least one demultiplexing module, in which each demultiplexing module is electrically connected to an input signal line and a plurality of output signal lines, each demultiplexing module comprises a plurality of demultiplexing units, each of the demultiplexing units comprises a data writing transistor and a compensation unit electrically connected to the data writing transistor, an output end of the data writing transistor is electrically connected to a corresponding output signal line; and
a switch control module, comprising a plurality of switch control units electrically connected to a switch control line, in which each of the switch control units is electrically connected to a clock signal line, each of the switch control units has an output end electrically connected to a control end of the data writing transistor of one of the demultiplexing units,
wherein each of the switch control units is configured to output the clock signal transmitted by the clock signal line to the control end of a corresponding demultiplexing unit according to a switch control signal transmitted by the switch control line, the compensation unit of each of the demultiplexing units is configured to detect a threshold voltage of the data writing transistor and receive a corresponding compensation control signal to compensate for the threshold voltage of the data writing transistor; and wherein the compensation unit comprises:
- a compensation transistor, in which an input end of the compensation transistor is electrically connected to a corresponding input signal line, the output end of the compensation transistor is electrically connected to the input end of the data writing transistor, the control end of the compensation transistor receives the corresponding compensation control signal; and
- a first capacitor, in which a first end of the first capacitor is electrically connected to the control end of the data writing transistor, a second end of the first capacitor is electrically connected to the output end of the data writing transistor.

2. The demultiplexing circuit according to claim 1, wherein each of the switch control units comprises:
a switch transistor, in which the control end of the switch transistor is electrically connected to the switch control line, the input end of the switch transistor is electrically connected to a corresponding clock signal line, the output end of the switch transistor is electrically connected to the control end of the data writing transistor of a corresponding demultiplexing unit.

3. The demultiplexing circuit according to claim 1, further comprising:
a voltage level reset module, comprising a plurality of voltage level reset units electrically connected to a reset control line, in which each of the voltage level reset units is electrically connected to a reset signal line, the output end of each of the voltage level reset unit is electrically connected to the output end of the data writing transistor of one of the demultiplexing units,
wherein each of the voltage level reset units is configured to output a reset signal transmitted by the reset signal line to the output of a corresponding data writing transistor according to a reset control signal transmitted by the reset control line.

4. The demultiplexing circuit according to claim 3, wherein each of the voltage level reset units comprises:
a reset transistor, in which the control end of the reset transistor is electrically connected to the reset control line, the input end of the reset transistor is electrically connected to a corresponding reset signal line, the output end of the reset transistor is electrically connected to the output end of the data writing transistor of a corresponding demultiplexing unit.

5. The demultiplexing circuit according to claim 3, wherein:
the plurality of voltage level reset units comprise a first reset unit and a second reset unit that are electrically connected to the reset control line, the first reset unit is electrically connected to a first reset signal line, the second reset unit is electrically connected to a second reset signal line;
the plurality of switch control units comprise a first switch control unit and a second switch control unit that are electrically connected to the switch control line, the first switch control unit is electrically connected to a first clock signal line, the second switch control unit is electrically connected to a second clock signal line;
the demultiplexing module comprises a first demultiplexing module, the plurality of demultiplexing units comprised in the first demultiplexing module comprise at least a first demultiplexing unit and a second demultiplexing unit, the first demultiplexing unit is electrically connected to a first input signal line and a first output signal line, the second demultiplexing unit is electrically connected to the first input signal line and a second output signal line, wherein the control end of the data writing transistor comprised in the first demultiplexing unit is electrically connected to the output end of the first switch control unit, the output end of the data writing transistor comprised in the first demultiplexing unit is electrically connected to the output end of the first reset unit, the compensation unit of the first demultiplexing unit is configured to receive a first compensation control signal; the control end of the data writing transistor comprised in the second demultiplexing unit is electrically connected to the output end of the second switch control unit, the output end of the data writing transistor comprised in the second demultiplexing unit is electrically connected to the output end of the second reset unit, the compensation unit of the second demultiplexing unit is configured to receive a second compensation control signal.

6. The demultiplexing circuit according to claim 5, wherein the demultiplexing module comprises a second demultiplexing module, the plurality of demultiplexing units comprised in the second demultiplexing module comprise at least a third demultiplexing unit and a fourth demultiplexing unit, the third demultiplexing unit is electrically connected to a second input signal line and a third output signal line, the fourth demultiplexing unit is electrically connected to the second input signal line and a fourth output signal line, wherein the control end of the data writing transistor comprised in the third demultiplexing unit is electrically connected to the output end of the first switch control unit, the output end of the data writing transistor comprised in the third demultiplexing unit is electrically connected to the output end of the first reset unit, the compensation unit of the third demultiplexing unit is configured to receive the first compensation control signal; the control end of the data writing transistor comprised in the fourth demultiplexing unit is electrically connected to the output end of the second switch control unit, the output end of the data writing transistor comprised in the fourth demultiplexing unit is electrically connected to the output end of the second reset unit, the compensation unit of the fourth demultiplexing unit is configured to receive the second compensation control signal.

7. The demultiplexing circuit according to claim 6, wherein:
the plurality of reset units comprise a third reset unit electrically connected to the reset control line, the third reset unit is electrically connected to a third reset signal line;
the plurality of switch control units comprise a third switch control unit electrically connected to the switch control line, the third switch control unit is electrically connected to a third clock signal line;
the plurality of demultiplexing units comprised in the first demultiplexing module comprise a fifth demultiplexing unit, the plurality of demultiplexing units comprised in the second demultiplexing module comprise a sixth demultiplexing unit, wherein the compensation units of the fifth demultiplexing unit and the sixth demultiplexing unit are configured to receive a third compensation control signal, the control end of the data writing transistor comprised in the fifth demultiplexing unit and the control end of the data writing transistor comprised in the sixth demultiplexing unit are electrically connected to the output end of the third switch control unit, the output end of the data writing transistor comprised in the fifth demultiplexing unit and the output end of the data writing transistor comprised in the sixth demultiplexing unit are electrically connected to the output end of the third reset unit.

8. The demultiplexing circuit according to claim 1, wherein each of the demultiplexing units further comprises:
a second capacitor, in which a first end of the second capacitor is electrically connected to the output end of the data writing transistor, a second end of the second capacitor is electrically connected to a corresponding input signal line.

9. A control method for a demultiplexing circuit, in which the demultiplexing circuit comprises at least one demultiplexing module, a switch control module and a reset control module, each demultiplexing module comprises a plurality of demultiplexing units, each of the demultiplexing units comprises a data writing transistor and a compensation unit electrically connected to the data writing transistor, the switch control module and the reset control module are coupled to each of the demultiplexing units, and the method comprises:
outputting, by the switch control module, a clock signal with a first voltage level to a control end of the data writing transistor of the demultiplexing unit according to a switch control signal to reset a voltage level of the control end of the data writing transistor;
outputting, by the reset control module, a reset signal to an output end of the data writing transistor of the demultiplexing unit according to a reset control signal to reset the voltage level of the output end of the data writing transistor;
transmitting, by the switch control module, the clock signal with a second voltage level to the control end of the data writing transistor according to the switch control signal to detect a threshold voltage of the data writing transistor by the compensation unit comprised in the demultiplexing unit; and
compensating, by the compensation unit of the demultiplexing unit, for the threshold voltage of the data writing transistor according to a corresponding compensation control signal;
wherein the compensation unit comprises:
a compensation transistor, in which an input end of the compensation transistor is electrically connected to a corresponding input signal line, the output end of the compensation transistor is electrically connected to the input end of the data writing transistor, the control end of the compensation transistor receives the corresponding compensation control signal; and
a first capacitor, in which a first end of the first capacitor is electrically connected to the control end of the data writing transistor, a second end of the first capacitor is electrically connected to the output end of the data writing transistor.

10. A display device, which comprises a demultiplexing circuit, the demultiplexing circuit comprising:
at least one demultiplexing module, in which each demultiplexing module is electrically connected to an input signal line and a plurality of output signal lines, each demultiplexing module comprises a plurality of demultiplexing units, each of the demultiplexing units comprises a data writing transistor and a compensation unit electrically connected to the data writing transistor, an output end of the data writing transistor is electrically connected to a corresponding output signal line; and
a switch control module, comprising a plurality of switch control units electrically connected to a switch control line, in which each of the switch control units is electrically connected to a clock signal line, each of the switch control units has an output end electrically connected to a control end of the data writing transistor of one of the demultiplexing units,
wherein each of the switch control units is configured to output the clock signal transmitted by the clock signal line to the control end of a corresponding demultiplexing unit according to a switch control signal transmitted by the switch control line, the compensation unit of each of the demultiplexing units is configured to detect a threshold voltage of the data writing transistor and receive a corresponding compensation control signal to compensate for the threshold voltage of the data writing transistor; and
wherein the compensation unit comprises:
a compensation transistor, in which an input end of the compensation transistor is electrically connected to a corresponding input signal line, the output end of the compensation transistor is electrically connected to the input end of the data writing transistor, the control end of the compensation transistor receives the corresponding compensation control signal; and
a first capacitor, in which a first end of the first capacitor is electrically connected to the control end of the data writing transistor, a second end of the first capacitor is electrically connected to the output end of the data writing transistor.

11. The display device according to claim 10, wherein each of the switch control units comprises:
a switch transistor, in which the control end of the switch transistor is electrically connected to the switch control line, the input end of the switch transistor is electrically connected to a corresponding clock signal line, the output end of the switch transistor is electrically connected to the control end of the data writing transistor of a corresponding demultiplexing unit.

12. The display device according to claim 10, further comprising:
a voltage level reset module, comprising a plurality of voltage level reset units electrically connected to a reset control line, in which each of the voltage level reset units is electrically connected to a reset signal line, the output end of each of the voltage level reset unit is electrically connected to the output end of the data writing transistor of one of the demultiplexing units,
wherein each of the voltage level reset units is configured to output a reset signal transmitted by the reset signal line to the output of a corresponding data writing transistor according to a reset control signal transmitted by the reset control line.

13. The display device according to claim 12, wherein each of the voltage level reset units comprises:
a reset transistor, in which the control end of the reset transistor is electrically connected to the reset control line, the input end of the reset transistor is electrically connected to a corresponding reset signal line, the output end of the reset transistor is electrically connected to the output end of the data writing transistor of a corresponding demultiplexing unit.

14. The display device according to claim 12, wherein:
the plurality of voltage level reset units comprise a first reset unit and a second reset unit that are electrically connected to the reset control line, the first reset unit is electrically connected to a first reset signal line, the second reset unit is electrically connected to a second reset signal line;
the plurality of switch control units comprise a first switch control unit and a second switch control unit that are electrically connected to the switch control line, the first switch control unit is electrically connected to a first clock signal line, the second switch control unit is electrically connected to a second clock signal line;
the demultiplexing module comprises a first demultiplexing module, the plurality of demultiplexing units comprised in the first demultiplexing module comprise at least a first demultiplexing unit and a second demultiplexing unit, the first demultiplexing unit is electrically connected to a first input signal line and a first output signal line, the second demultiplexing unit is electrically connected to the first input signal line and a second output signal line,
wherein the control end of the data writing transistor comprised in the first demultiplexing unit is electrically connected to the output end of the first switch control unit, the output end of the data writing transistor comprised in the first demultiplexing unit is electrically connected to the output end of the first reset unit, the compensation unit of the first demultiplexing unit is configured to receive a first compensation control signal; the control end of the data writing transistor comprised in the second demultiplexing unit is electrically connected to the output end of the second switch control unit, the output end of the data writing transistor comprised in the second demultiplexing unit is electrically connected to the output end of the second reset unit, the compensation unit of the second demultiplexing unit is configured to receive a second compensation control signal.

15. The display device according to claim 14, wherein the demultiplexing module comprises a second demultiplexing module, the plurality of demultiplexing units comprised in the second demultiplexing module comprise at least a third demultiplexing unit and a fourth demultiplexing unit, the third demultiplexing unit is electrically connected to a second input signal line and a third output signal line, the fourth demultiplexing unit is electrically connected to the second input signal line and a fourth output signal line,
wherein the control end of the data writing transistor comprised in the third demultiplexing unit is electrically connected to the output end of the first switch control unit, the output end of the data writing transistor comprised in the third demultiplexing unit is electrically connected to the output end of the first reset unit, the compensation unit of the third demultiplexing unit is configured to receive the first compensation control signal; the control end of the data writing transistor comprised in the fourth demultiplexing unit is electrically connected to the output end of the second switch control unit, the output end of the data writing transistor comprised in the fourth demultiplexing unit is electrically connected to the output end of the second reset unit, the compensation unit of the fourth demultiplexing unit is configured to receive the second compensation control signal.

16. The display device according to claim 15, wherein:
the plurality of reset units comprise a third reset unit electrically connected to the reset control line, the third reset unit is electrically connected to a third reset signal line;
the plurality of switch control units comprise a third switch control unit electrically connected to the switch control line, the third switch control unit is electrically connected to a third clock signal line;
the plurality of demultiplexing units comprised in the first demultiplexing module comprise a fifth demultiplexing unit, the plurality of demultiplexing units comprised in the second demultiplexing module comprise a sixth demultiplexing unit,
wherein the compensation units of the fifth demultiplexing unit and the sixth demultiplexing unit are configured to receive a third compensation control signal, the control end of the data writing transistor comprised in the fifth demultiplexing unit and the control end of the data writing transistor comprised in the sixth demultiplexing unit are electrically connected to the output end of the third switch control unit, the output end of the data writing transistor comprised in the fifth demultiplexing unit and the output end of the data writing transistor comprised in the sixth demultiplexing unit are electrically connected to the output end of the third reset unit.

17. The display device according to claim 10, wherein each of the demultiplexing units further comprises:
a second capacitor, in which a first end of the second capacitor is electrically connected to the output end of the data writing transistor, a second end of the second capacitor is electrically connected to a corresponding input signal line.

18. The display device according to claim 10, further comprising a driving module and a display panel electrically connected to the demultiplexing circuit,
wherein the display panel comprises a plurality of sub-pixels and the plurality of output signal lines electrically connected to the plurality of sub-pixels, the driving module is electrically connected to the demultiplexing circuit via the input signal lines.

* * * * *